United States Patent [19]

Schuppan et al.

[11] Patent Number: 4,596,940
[45] Date of Patent: Jun. 24, 1986

[54] THREE STATE DIFFERENTIAL ECL BUS DRIVER

[75] Inventors: W. Alan Schuppan, Ft. Collins; Walter L. Gregory, Jr., Loveland, both of Colo.

[73] Assignee: Hewlett-Packard Company, Palo Alto, Calif.

[21] Appl. No.: 601,840

[22] Filed: Apr. 19, 1984

[51] Int. Cl.⁴ ............... H03K 17/66; H03K 19/003; H03K 19/086; H03K 19/20
[52] U.S. Cl. .................... 307/443; 307/445; 307/455; 307/473; 307/241; 307/270
[58] Field of Search ............... 307/239, 240, 241, 270, 307/440, 442, 443, 445, 455, 473, 475, 454

[56] References Cited

U.S. PATENT DOCUMENTS

| | | | |
|---|---|---|---|
| 3,140,405 | 7/1964 | Kolling | 307/443 |
| 3,573,635 | 4/1971 | Da Costa | 307/443 X |
| 3,769,525 | 10/1973 | Foss et al. | 307/241 X |
| 3,832,575 | 8/1974 | Dasgupta et al. | 307/443 |
| 3,935,480 | 1/1976 | Stuckert | 307/241 |
| 4,315,167 | 2/1982 | Pelc | 307/443 X |
| 4,347,446 | 8/1982 | Price | 307/455 X |
| 4,553,049 | 11/1985 | Cha et al. | 307/443 |

OTHER PUBLICATIONS

Couch, "Switchable Current Source Line Driver"; *IBM Tech. Discl. Bull.*, vol. 15, No. 4, pp. 1310-1311; 9/1972.
Femling, "Tri-State Logic in Modular Systems"; *NS Corp.* (Pub.), 1971; pp. 1-15.

*Primary Examiner*—Larry N. Anagnos
*Attorney, Agent, or Firm*—Bloor Redding, Jr.

[57] ABSTRACT

A three state Emitter Coupled Logic (ECL) differential bus driver is capable of driving a multiply driven balanced ECL bus which is isolated from a supply voltage $V_{EE}$ and therefore provides isolation from ground loops, higher performance, lower cost, lower noise, reduced electromagnetic radiation and reduced sensitivity to ground voltage variations.

8 Claims, 4 Drawing Figures

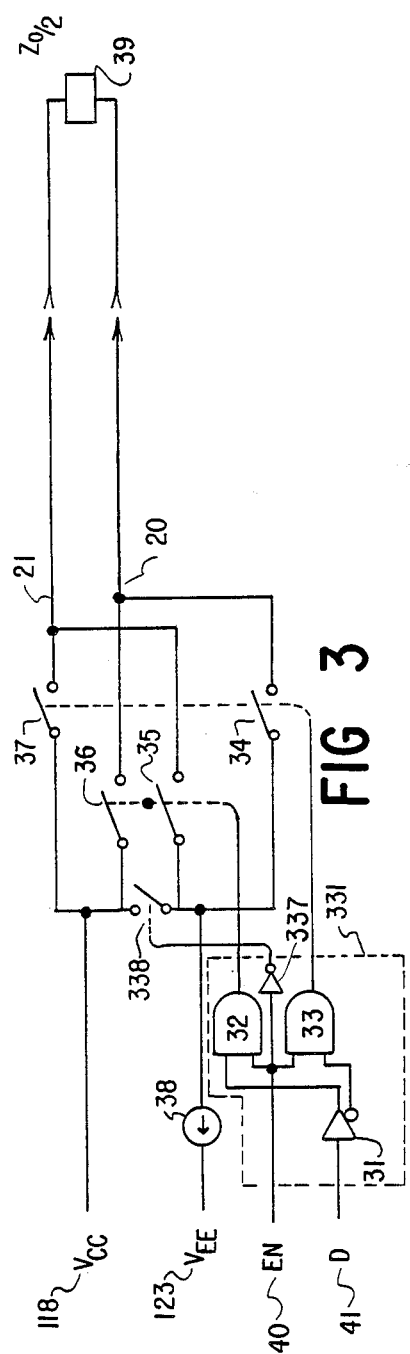
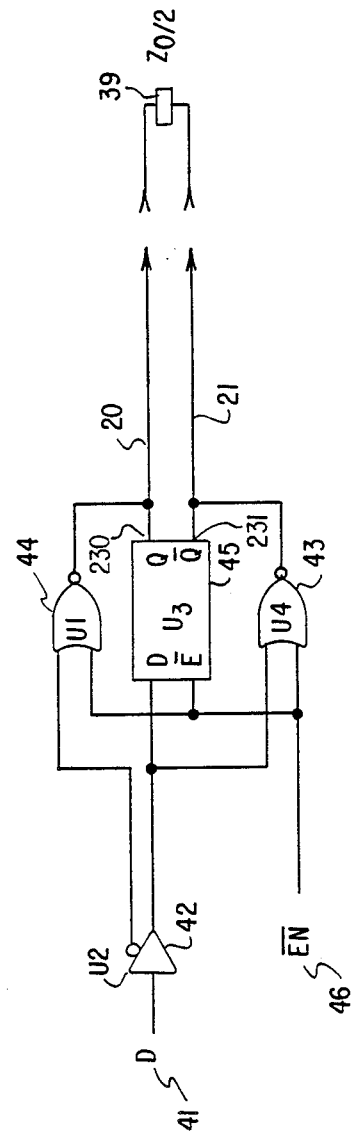

4,596,940

THREE STATE DIFFERENTIAL ECL BUS DRIVER

BACKGROUND

Emitter Coupled Logic (ECL) is a family of high-speed digital logic devices which are commonly used in high performance digital systems. Traditionally ECL has been used in mainframe computers, wherein the fastest possible switching rates translated almost directly into system performance. However, today ECL is increasingly being used in the areas of communications, instrumentation and peripherals.

In the design of large digital systems, it is usually desirable to organize data paths into multiply driven busses. This provides a cost savings and size savings by allowing several line drivers to share a common bus. This also saves line receivers, since data is received on only one bus. The prior art ECL busses have traditionally been OR-ed busses constructed using emitter follower outputs of the ECL gates and pull down resistors. These busses have several severe disadvantages, for example: susceptibility to ground loops, noise, and high frequency oscillations. These problems may be avoided by using a differential or balanced bus. Although differential bus receivers are available in integrated ECL circuits, differential bus drivers for multiply driven busses are not available. The differential bus driver function is therefore normally achieved through the use of complementary gates, or single gates with resistor termination. This approach has many of the same problems as the OR-ed bus because, by coupling directly onto the supply rails, noise and other unwanted transients are introduced to the bus, thereby reducing the reliability, increasing the chances of radiating interference, and other problems. Furthermore, the surges of current when the driver changes state are coupled to the supply rails, thereby adding more noise to the system.

SUMMARY

In accordance with the preferred embodiment of the present invention, an apparatus is provided for multiply driving a balanced three state bus for Emitter Coupled Logic. The present apparatus is superior to the prior art in several ways. First, use of the balanced bus driver eliminates ground loops, thereby minimizing power supply offset problems, is lower in cost, has greater noise margins, and has lower electomagnetic radiation and susceptibility. Second, balanced transmission lines exhibit better performance because of the generation of virtual ground planes. Third, the present invention offers reduced circuit complexity that permits reduced size, weight, and cost and is easily integratable.

DESCRIPTION OF THE DRAWINGS

FIG. 3 is a functional diagram of the present invention.

FIG. 4 is a schematic of a preferred embodiment of the present invention.

DESCRIPTION OF THE PREFERRED EMBODIMENT

Figure 1:
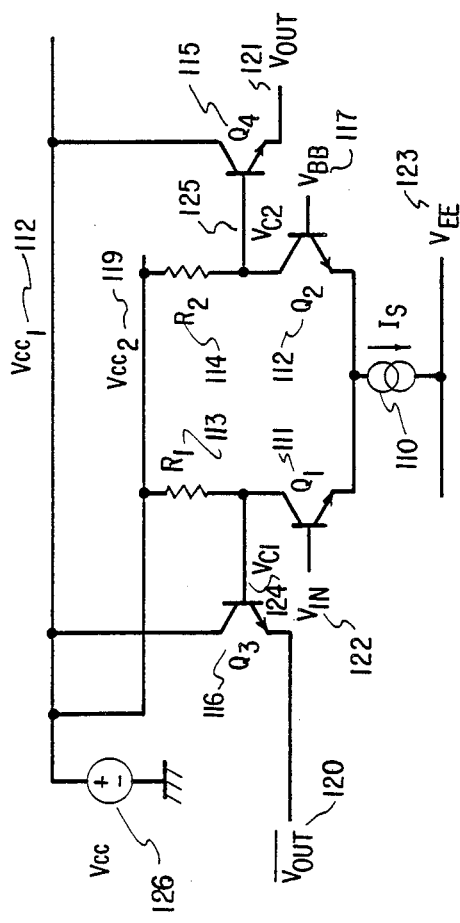
FIG. 1 illustrates a basic ECL buffered current switch.

FIG. 1 illustrates a basic ECL buffered current switch typical of the prior art. Referring to FIG. 1, at the bottom of every ECL switch, literally and figuratively, is a current source 110. In the basic ECL switch, a logic operation consists of steering the current through either of two return paths to a source of supply voltage $V_{CC}$ 126; the state of the switch can be detected from the resultant voltage drop across resistors $R_1$ 113 and $R_2$ 114. The net voltage swing is determined by the value of the resistor and the magnitude of the current. Furthermore, these two values are chosen to accomplish the charging and discharging of all of the parasitic capacitance present at the desired switching rate. The voltage swing of switch input signal $V_{IN}$ 122 required to control the state of the switch is relatively small because of the exponential change of emitter current with base-emitter voltage and because of the differential mode of operation. A signal swing of as little as 850 mV is sufficient to change the state of the switch with good noise immunity. These voltage swings are considerably smaller than the 2 volts generally required for Transistor-Transistor Logic (TTL).

The collector voltage $V_{C1}$ 124 of Q1 transistor 111 ranges from supply voltage $V_{CC}$ 126, when transistor 111 is off, to approximately −0.98 volts when transistor 111 is conducting all of the current supplied by current source 110. To make these voltage levels compatible with the voltages required to drive the input of another current switch, emitter follower transistors 115 and 116 are added as shown in FIG. 1. In addition to translating the collector voltage $V_{C1}$ 124 of transistor 111 and collector voltage $V_{C2}$ 125 of transistor 112 downward, the emitter follower transistors 115 and 116 also isolate the collector nodes from load capacitance and provide current gain. Since the output impedance of the emitter follower transistors 115 and 116 is low, approximately 7 ohms, ECL circuits can drive transmission lines having characteristic impedances of 25 ohms or more.

Since the operation of the ECL switch is differential in nature, noise signals which approach gate threshold voltage $V_{BB}$ 117 in potential are propagated through to the next stage. Furthermore, a high noise level increases the probability that the circuit may oscillate at very high frequencies. There are many sources of noise, however one source of noise which is more easily addressed is the reflection of the signals caused by the interconnections between circuits. Such interconnections are particularly prevalent in large digital systems. These interactions between wiring and circuitry in high speed systems are more easily determined by treating the interconnections as mismatched transmission lines. Several solutions are available in the prior art for reducing such reflections, for example: close attention to the impedance characteristics of interconnected lines, which is expensive, or the addition of series or parallel termination to interconnect lines. Series termination can reduce performance. Parallel termination involves adding pull-down resistors to supply voltage $V_{EE}$. Use of a pull-down resistor to supply voltage $V_{EE}$ generates a single return path for all signal currents. This causes noise, generated by the many rapid surges in current through the supply lines from supply voltage $V_{EE}$, to be introduced to the bus, perhaps causing oscillations that tend to radiate and cause Radio Frequency Interference (RFI). Use of a common return also permits local variations in the potential of supply voltage $V_{EE}$ 123 which further increase the sensitivity of the system to noise by varying the gate threshold voltage.

In the design of large digital systems, it is usually desirable to organize data paths into multiply driven buses. This provides a cost savings and size savings by allowing several line drivers to share a common bus. This also minimizes the number of line receivers, since data is received on only one bus. In the case of multiply driven busses, only one driver may be active at a time, requiring that the drivers have a high impedance off state. The prior art solution has been the use of an OR-ed bus consisting of a multiple drivers, each having emitter follower outputs that operate in either a logic true, or off state. Pull-down resistors to supply voltage $V_{EE}$ are used to generate the logic false state. The use of pull-down resistors causes the problems outlined above. A superior solution involves the use of a balanced or differential bus, which is isolated from the system supply voltage $V_{EE}$ and wherein the currents on the first side and the second side of the bus are approximately equal. The advantages of such a solution include the elimination of ground loops, minimal power supply offset problems, lower cost, greater noise margin, lower electromagnetic radiation and susceptibility, and better transmission line performance because of generation of virtual ground planes.

Figure 2:
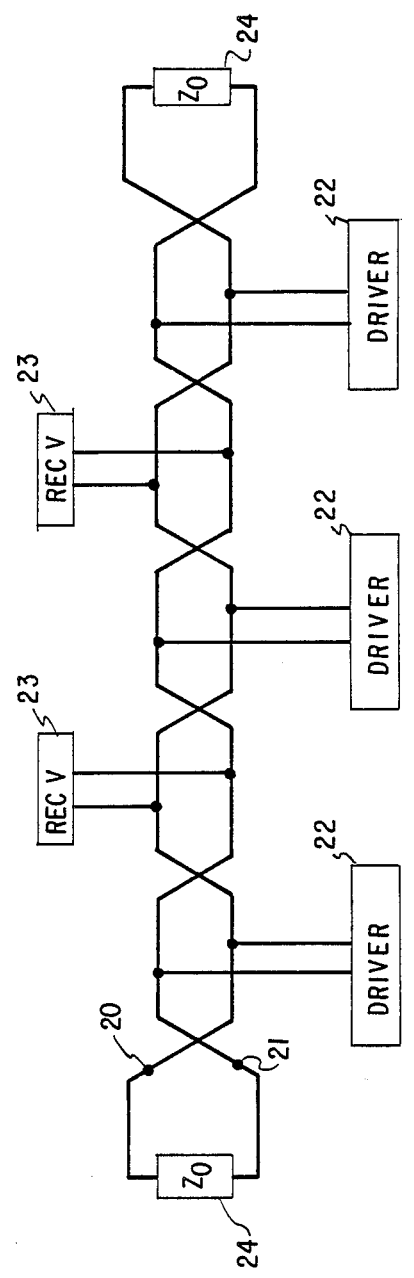
FIG. 2 illustrates a differential bus of the type contemplated to be driven by the present invention.

FIG. 2 illustrates a differential bus of the type contemplated to be driven by the present invention. The bus consists of a first side 20 and second side 21. The bus has a characteristic impedance of $Z_0$ and is terminated at both ends by termination resistors 24 equal to the characteristic impedance of the bus. Attached to the bus are the drivers 22 and receivers 23. Neither the first side 20 nor the second side 21 of the differential bus is coupled directly to either supply voltage $V_{CC}$ or supply voltage $V_{EE}$ by passive components; both sides of the bus are actively driven. Each driver 22 must be capable of operating in one of three states. The first state is "high," wherein the driver 22 supplies the logic true reference voltage to the first side 20 of the bus while sinking the appropriate current from the second side 21 of the bus. The second state is "low," wherein the driver 22 supplies a logic true reference voltage to the second side 21 of the bus while sinking the appropriate current from the first side 20 of the bus. The third state is "off," wherein the driver 22 neither supplies a reference voltage nor sinks a current from either the first side 20 or the second side 21 of the bus. As a result of the above described operation, all the references are supplied by the active driver, and the current supplied from the voltage reference on one side of the driver 22 is approximately equal to the current sunk by current source attached to the other side. This eliminates the ground loop and different ground potential problems of the prior art. Since the side with low potential, approximately logic false potential caused by the voltage dropped across the termination resistors, is isolated from the digital system supply voltage $V_{EE}$ and the currents and the impedances of the system are matched, there is considerably higher noise immunity.

Although differential bus receivers are available in integrated ECL circuits, differential bus drivers for multiply driven busses are not available. The differential bus driver function is therefore achieved in the prior art through the use of complementary gates or single gates with resistor termination. See ECL Data Book, Fairchild Camera and Instrument Corporation, 464 Ellis St., Mountain View, CA 94042. Again both of these methods involve the use of pull-down resistors to a common return line, supply voltage $V_{EE}$, which destroys many of the advantages of the differential or balanced bus approach.

FIG. 3 is a functional diagram of a three state differential bus driver in accordance with the present invention and of the type contemplated to drive the bus illustrated in FIG. 2. The driver comprises four switches, 34, 35, 36, and 37, that connect supply voltage $V_{CC}$ or supply voltage $V_{EE}$, through the current source 38, alternatively to the first side 20 and second side 21 of the differential bus under the control of logic 331. In this embodiment, the logic 331 comprises gates 31, 32, and 33. The driver operates as follows: when the enable signal 40 is logic false, the output of both AND gates 32 and 33 are logic false causing the switches 34, 35, 36, and 37 to be in the open state, permitting both the first and second side of the differential bus to float. Hence, the driver is in the "off" state. The driver remains in the "off" state regardless of the logic state of the data signal 41. During this time, the noise generated by the driver can be further reduced by connecting the current source 38 to supply voltage $V_{CC}$ 118. This avoids the power supply current changes when the driver is enabled or disabled and is accomplished by optional switch 338, under the control of logic 331. Logic 331 further comprises INVERTER 337 which complements the enable signal. When the output of gate 337 is logic true, switch 338 is actuated, thereby connecting the supply voltage $V_{CC}$ to the current source 38. When the output of 337 is logic false, switch 338 is open and the current must flow from supply voltage $V_{CC}$ 118 through the bus to reach the current source 38.

When the enable signal 40 is logic true, the output of the driver is dependent on the state of the data signal 41. The BUFFER/INVERTER gate 31 generates both the data logic state and its complement. When data signal 41 is logic true and enable signal 40 is logic true, the inputs to AND gate 32 are both logic true; therefore, the output is logic true. When the output of gate 32 is logic true, switches 35 and 36 are actuated, thereby connecting the first side 20 to supply voltage $V_{CC}$ 118 and the second side 21 to supply voltage $V_{EE}$ 123 through the current source 38. Current source 38 acts to decouple the second side 21 of the bus from the supply voltage $V_{EE}$ 123. The inputs to AND gate 33 are logic true and false; therefore, the output is logic false. This causes switches 34 and 37 to remain open and places the driver in the "high" state. When data signal 41 is logic false and enable signal 40 is logic true, the inputs to AND gate 33 are both logic true; therefore, the output is logic true. When the output of gate 33 is logic true, switches 34 and 37 are activated, thereby connecting the second side 21 to supply voltage $V_{CC}$ 118 and the first side 20 to supply voltage $V_{EE}$ 123 through the current source 38. Again, the current source 38 acts to decouple the first side from the supply voltage $V_{EE}$. The inputs to AND gate 32 are logic true and false; therefore, the output is logic false and causes switches 35 and 36 to open. Hence the driver is in the "low" state. The differential bus appears to be terminated by the load 39 equal to $Z_0/2$, which is the result of the two termination resistors 24 connected in parallel. The magnitude of the current flowing through the current source 38 is such that the voltage dropped across the load 39 is approximately equal to the desired logic voltage swing. This is assuming ideal switches, if less than ideal switches are used, for example transistors, then the voltage generated across load 39 needs to be such that the switches are acting most like ideal switches. For transistors, this means they should be reverse biased by, for example, 0.3 volts for silicon transistors to present a high impedance to the bus. This may be accomplished by reducing the current through the current source 38 to reduce the voltage developed across the load 39 by the 0.3 volts. The switches must present a high impedence to the bus to reduce reflections.

FIG. 4 illustrates a preferred embodiment of the present invention, a driver for driving the bus illustrated in FIG. 2 for the ECL family and functionally compatible with the driver illustrated in FIG. 3. The driver consists of four integrated circuit gates 42, 43, 44, and 45. The driver drives the load 39 which is approximately equal to $Z_0/2$ and represents a doubly terminated balanced transmission line whose characteristic impedance is $Z_0$ as shown in FIG. 2. For purposes of argument, it will be assumed that these devices are constructed entirely of bipolar NPN transistors, a fact that makes this circuit integratable using commonly available processes. This circuit may be constructed using PNP transistors by reversing the polarity of the appropriate current and voltage sources. The components labeled U1 44 and U4 43 comprise two-input NOR gates. Component U2 42 comprises a BUFFER/INVERTER. NOR gate 44, BUFFER/INVERTER 42, and NOR gate 43 have emitter follower transistor outputs as illustrated in FIG. 1 and discussed above. Component U3 45, rather than having emitter follower transistor outputs, has a current source for outputs. Its operation is defined in the following table. The minus signs before the currents imply current flowing into the device. The symbol "1" represents logic true. The symbol "0" represents logic false. The symbol "X" represents a logic "don't care" state.

| $\overline{E}$ | D | Q (230) | $\overline{Q}$ (231) |
|---|---|---|---|
| 1 | X | off | off |
| 0 | 1 | off | $-Io$ |
| 0 | 0 | $-Io$ | off |

The output current, Io, is chosen so that the voltage representing logic false on the bus, which is Io multiplied by $Z_0/2$, is a predetermined voltage less than the voltage difference between the logic true and logic false output voltage levels of NOR gate 44 or NOR gate 43. This predetermined voltage should be as small as possible as explained later, 0.2 volt to 0.5 volt is sufficient for the ECL logic family. This choice will be explained later. With multiple drivers on a bus, it is assumed that only one driver at a time is enabled. All other drivers are disabled and should appear as high impedance loads on the bus.

A prototype construction of this circuit was accomplished by using the following commercially available Emitter Coupled Logic parts available from Motorola Corp., Phoenix, Ariz., and others in place of the generic names give in the above schematic. U1 is MC10123; U2 is MC10101; U3 is MC10192; and U4 is MC10123. The bus impedance was chosen such that $Z_0=100$ ohms. These parts are all fabricated under the same process using nothing but NPN transistors. It is therefore anticipated that all these parts would be integrated into a single monolithic semiconductor part.

The disable signal 46, $\overline{EN}$, is logic false for the one enabled driver on the bus. The disable signal 46 is the complement of the enable signal 40 in FIG. 3 above. The driver functions as follows: if data signal 41 is logic true and disable signal 46 is logic false, then the emitter follower output of NOR gate 44 is active applying supply voltage $V_{CC}$ to the first side 20, fixing the maximum voltage of the first side 20. Meanwhile, the inverted output 231 of U3 45 is drawing current from the second side 21 producing a potential on the second side 21 that is lower than the potential on the first side 20 by $Io*Z_0/2$ volts. The emitter follower transistor output of NOR gate 43 is off with its output emitter follower reverse biased, since the output current, Io, is chosen to be unable to develop sufficient voltage across the load 39 to forward bias the emitter follower. The current that would have been necessary to forward bias the output transistor of NOR gate 44 is the current needed to develop a voltage across the load 39 greater than the potential difference between true and false logic levels of NOR gate 43.

A similar situation exists when data signal 41 is logic false and disable signal 46 is logic false. The only difference is that the emitter follower output of NOR gate 43 is now active applying supply voltage $V_{CC}$ to the second side 21 of the bus and the non-inverted output 230 of U3 45 is now sinking current from the first side 20 of the bus. The disable signal 46 is logic true for every other such driver that may be connected to the bus. When the disable signal 46 is logic true, both NOR gate emitter follower transistor outputs are off and U3 45 current sources are disconnected from both outputs. Since the potential on both the first side 20 and second side 21 of the bus is greater than the one diode drop below the base voltage on the emitter follower transistor outputs of the NOR gates, the transistors are reverse biased and therfore provide a high impedance load to the bus. This minimizes line impedance discontinuities that could cause undesirable reflections.

We claim:

1. An apparatus for differentially driving to three states: high, low, and off, a two wire bus with first and second sides and terminated at both ends with an impedance equal to the characteristic impedance of the bus, the bus driven in response to a data signal with logic true and false states and an enable signal with logic true and false states, the apparatus comprising:

a voltage reference at a predetermined potential representing logic true;

a current source with a predetermined current;

first switching means for connecting the voltage reference to the first side of the bus;

second switching means for connecting the voltage reference to the second side of the bus;

third switching means for connecting the current source to the second side of the bus;

fourth switching means for connecting the current source to the first side of the bus; and logic means connected to first, second, third and fourth switching means for actuating, in response to data and enable signals, the first switching means when enable is logic true and data is logic true else disconnected, the second switching when enable is logic true and data is logic false else disconnected, the third switching means when enable is logic true and data is logic true else disconnected and the fourth switching means when enable is logic true and data is logic false else disconnected.

2. An apparatus as in claim 1 further comprising a fifth switching means connected to the logic means for connecting the voltage reference to the current source, the logic means actuating the fifth switching means when enable is logic false else disconnected.

3. An apparatus as in claim 2 wherein the first, second, third, fourth and fifth switching means are bipolar transistors having collector-base and base-emitter junctions.

4. An apparatus as in claim 3 wherein the predetermined current is approximately equal to the predetermined potential representing logic true less one half the forward voltage drop over the base-emitter junction, divided by one half the characteristic impedance of the bus.

5. An apparatus as in claim 1 wherein the predetermined current is approximately equal to the predetermined potential representing logic true divided by one half the charateristic impedance of the bus.

6. An apparatus for differentially driving to three states; high, low, and off, a two wire emitter coupled logic bus with first and second sides and terminated at both ends with an impedance equal to the characteristic impedance of the bus, the bus driven in response to a data signal with logic true and false states and a disable signal with logic true and false states, the apparatus comprising:

buffer gate with the input connected to the data signal and a complemented and uncomplemented output;

first NOR gate with output connected to the first side of the bus and one input connected to the disable signal and the other input connected to complemented output of the buffer gate;

second NOR gate with output connected to the second side of the bus and one input connected to the disable signal and the other input connected to the uncomplemented output of the buffer gate; and switched current source means with uncomplemented output connected to the first side of the bus and the complemented output connected to the second side of the bus containing a current source with a predetermined current and switch for connecting the current source to uncomplemented output when disable is logic false and the uncomplemented output of the buffer gate is logic false or the complemented output when the disable signal is logic false and the uncomplemented output of the buffer gate is logic true and to neither output when the disable signal is logic true.

7. An apparatus as in claim 6 wherein the switched current source further comprises a voltage reference equal to logic true for switching the current source to when connected to neither output.

8. An apparatus as in claim 7 wherein the predetermined current is approximately equal to the difference between the voltages representing logic true and logic false less 0.3 volts, divided by one half the characteristic impedance of the bus.

* * * * *